United States Patent
Afentakis et al.

(10) Patent No.: US 8,691,672 B2
(45) Date of Patent: Apr. 8, 2014

(54) METHOD FOR THE SELECTIVE OXIDATION OF SILICON NANOPARTICLE SEMICONDUCTOR FILMS IN THE PRESENCE OF TITANIUM

(75) Inventors: Themistokles Afentakis, Vancouver, WA (US); Karen Yuri Nishimura, La Center, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 189 days.

(21) Appl. No.: 13/433,072

(22) Filed: Mar. 28, 2012

(65) Prior Publication Data
US 2013/0256675 A1    Oct. 3, 2013

(51) Int. Cl.
*B82Y 30/00*    (2011.01)
(52) U.S. Cl.
USPC ........... 438/492; 977/720; 977/778; 977/814; 977/721; 257/66; 257/763; 438/478
(58) Field of Classification Search
CPC .............................. B82Y 40/00; B82Y 30/00
USPC ............. 257/66; 977/720, 721, 773, 778
See application file for complete search history.

(56) References Cited

U.S. PATENT DOCUMENTS

| | | | |
|---|---|---|---|
| 2,921,861 A * | 1/1960 | Stanley et al. | 501/96.3 |
| 7,422,708 B2 | 9/2008 | Kunze et al. | |
| 2006/0017106 A1 * | 1/2006 | Suh et al. | 257/347 |
| 2006/0154036 A1 | 7/2006 | Kunze et al. | |
| 2007/0057255 A1 * | 3/2007 | Murray et al. | 257/40 |
| 2007/0114387 A1 * | 5/2007 | Chang et al. | 250/288 |
| 2008/0048240 A1 * | 2/2008 | Kamath et al. | 257/315 |
| 2008/0152938 A1 | 6/2008 | Kelman et al. | |
| 2008/0254601 A1 * | 10/2008 | Terry et al. | 438/502 |
| 2009/0280641 A1 * | 11/2009 | Kang et al. | 438/653 |

OTHER PUBLICATIONS

Ma, "Titanium Silicide Technology", in Silicide Technology for Integrated Circuits, Lih J. Chen, Ed., published by The Institution of Electrical Engineers, 2004.*

Ruzyllo "Comparison of Silicides" (class materials posted online by Professor Ruzyllo of Penn State University), posted Feb. 15, 2008 at http://www.semi1source.com/notes/ViewFile.asp?Which=104.*

* cited by examiner

*Primary Examiner* — Fernando L Toledo
*Assistant Examiner* — Peter Bradford
(74) *Attorney, Agent, or Firm* — Law Office of Gerald Maliszewski; Gerald Maliszewski

(57) ABSTRACT

A method is provided for consuming oxides in a silicon (Si) nanoparticle film. The method forms a colloidal solution film of Si nanoparticles overlying a substrate. The Si nanoparticle colloidal solution film is annealed at a high temperature in the presence of titanium (Ti). In response to the annealing, Si oxide is consumed in a resultant Si nanoparticle film. In one aspect, the consuming the Si oxide in the Si nanoparticle film includes forming Ti oxide in the Si nanoparticle film. Also in response to a low temperature annealing, solvents are evaporated in the colloidal solution film of Si nanoparticles. Si and Ti oxide molecules are sintered in the Si nanoparticle film in response to the high temperature annealing.

18 Claims, 4 Drawing Sheets

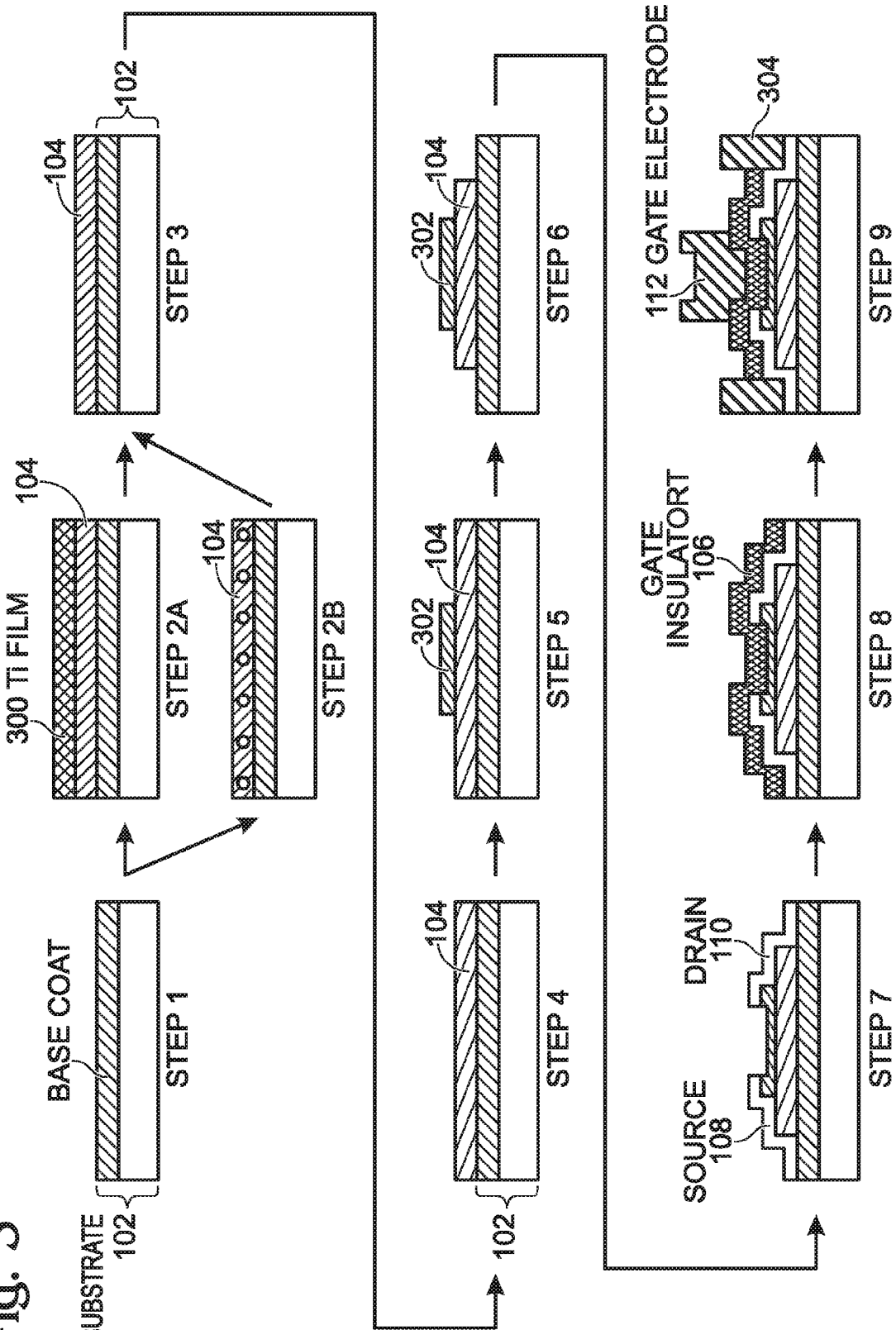

METHOD FOR THE SELECTIVE OXIDATION OF SILICON NANOPARTICLE SEMICONDUCTOR FILMS IN THE PRESENCE OF TITANIUM

BACKGROUND OF THE INVENTION

1. Field of the Invention

This invention generally relates to integrated circuit (IC) fabrication and, more particularly, to a method of consuming oxidation that occurs in the formation of a silicon (Si) nanoparticle film.

2. Description of the Related Art

Low temperature and low thermal budget processing for large area electronics is gaining momentum with many recent advances involving non-vacuum deposition, etching steps (such as printing), and roll-to-roll, low-cost techniques on flexible substrates. One way to form the active semiconductor film for a thin-film transistor in such a printing-compatible process is by the use of Si, or other semiconductor, in the form of a nanoparticle liquid suspension (termed nanofluid suspension). Particle sizes for Si can range from <1 nm to >100 nm, based on the desired application. This process typically involves the selective deposition of the nanofluid, and one or more elevated temperature steps aiming at the evaporation of the various solvents of the suspension and the sintering of nanoparticles to form an interconnected porous nanoparticle film and/or a homogeneous semi-conducting film.

One problem common with the processing of Si nanofluids is the spontaneous formation of silicon dioxide on the surface of the nanoparticles. A thin oxide forms within seconds after exposure in air in ambient temperature. Thicker oxides form during the aforementioned elevated temperature steps, if they take place in an oxidizing environment. This oxide can easily reach thicknesses that severely limit the conductivity of the semiconductor, and can also severely limit the sintering process. One solution to this problem is to prevent the exposure of the nanofluid to an oxidizing environment until sintering is accomplished. While feasible, this certainly entails increasing the level of complexity and sophistication of the processing steps (i.e. processing in low pressure, inert gas atmosphere, etc.), which runs counter to the quick-and-inexpensive target of this approach.

It would be advantageous if semiconductor nanoparticles films could be formed in a low complexity process, without forming semiconductor oxide products.

SUMMARY OF THE INVENTION

Disclosed herein is a process for the fabrication of a non-self-aligned top-gate MOS field effect transistor using a sintered Si nanoparticle film for the active layer. The nanoparticle film is coated on the substrate with spin coating or another suitable method, such as extrusion coating, spraying, printing, etc. The nanoparticle film is coated in a colloidal suspension form. Typically, one low-temperature annealing step (soft-bake) is used to evaporate the solvent of the deposited film, followed by a higher temperature anneal step, used to sinter the film.

A unique part of the process is the deposition of a thin titanium (Ti) layer on top of the Si nanoparticle film prior to the soft-bake step, or prior to the final annealing (sintering) step. In another aspect of the invention, the colloidal solution contains, along with the Si nanoparticles, a controlled amount of Ti nanoparticles.

Accordingly, a method is provided for consuming oxides in a silicon (Si) nanoparticle film. The method forms a colloidal solution film of Si nanoparticles overlying a substrate. The Si nanoparticle colloidal solution film is annealed in the presence of titanium (Ti). In response to the annealing, Si oxide is consumed in a resultant Si nanoparticle film. In one aspect, the consuming the Si oxide in the Si nanoparticle film includes forming Ti oxide in the Si nanoparticle film. Also in response to the annealing, Si and Ti oxide molecules are sintered in the Si nanoparticle film.

Additional details of the above-described method, an associated thin-film transistor (TFT) fabrication method, and a TFT with a Si nanoparticle active layer film including titanium (Ti) oxide, are provided below.

BRIEF DESCRIPTION OF THE DRAWINGS

FIG. 3 depicts a sequence of steps being performed in the fabrication of a TFT made using a semiconductor nanoparticle film process that consumes oxides.

DETAILED DESCRIPTION

Figure 1:
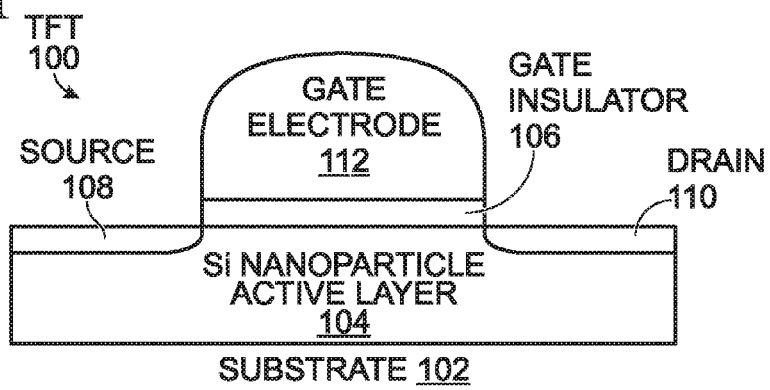
FIG. 1 is a partial cross-sectional view of a thin-film transistor (TFT) with a silicon (Si) nanoparticle active layer film including titanium (Ti) oxide.

FIG. 1 is a partial cross-sectional view of a thin-film transistor (TFT) with a silicon (Si) nanoparticle active layer film including titanium (Ti) oxide. The TFT 100 comprises a substrate 102, which may be a transparent material such as glass or a semiconductor. A Si nanoparticle active layer film 104, including Ti oxide, overlies the substrate 102. In some aspects, not shown, an insulator or basecoat may be formed interposed between the Si nanoparticle active layer film 104 and the substrate 102. A gate insulator 106 overlies the Si nanoparticle active layer film 104. A source region 108 and a drain region 110 are formed in the Si nanoparticle active layer film 104. A gate electrode 112 overlies the gate insulator 106. The Si nanoparticle active layer film 104 includes no Si oxide. In one aspect, the Si nanoparticle active layer film 104 may include Ti silicide.

Functional Description

The process used to form the TFT of FIG. 1 incorporates a small amount of Ti with the deposited Si nanoparticle film prior to the sintering step. The amount of Ti is determined by the amount of Si nanoparticles present in the film. The purpose is to have the Ti react with the all or most of the residual $SiO_2$ present in the film. An excessive amount of Ti reacts with, and consumes entire Si nanoparticles, forming titanium silicide, which is not necessarily desirable. These reactions take place during the main annealing (sintering) step. In one aspect of the Si nanoparticle film treatment, Ti is present in the form of nanoparticles in the Si particle solution. In another aspect, a thin Ti film is deposited on top of the silicon nanoparticle film, after the Si nanoparticle film is deposited on the substrate and a preliminary solvent evaporation anneal step is performed, prior to the final, higher temperature sintering step.

Figure 2A:
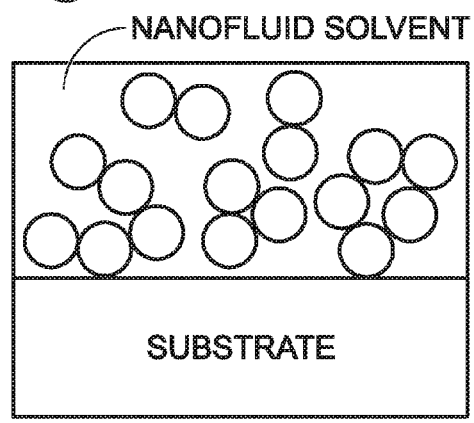
FIGS. 2A through 2C show a schematic sequence for the nanoparticle film deposition process.
Figure 2B:
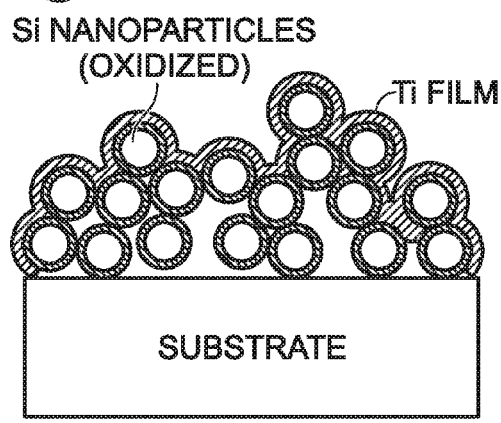
Figure 2C:
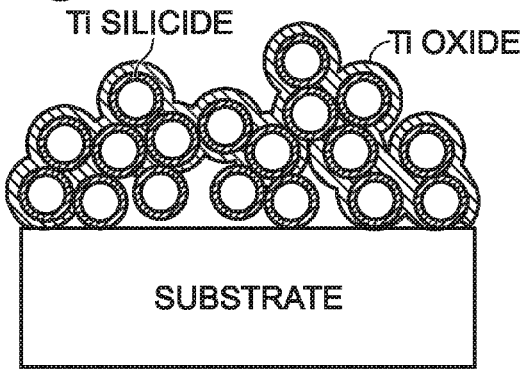

FIGS. 2A through 2C show a schematic sequence for the nanoparticle film deposition process. FIG. 2A shows nanofluid coating prior to solvent evaporation. FIG. 2B shows a the Ti film top coating. FIG. 2C depicts the formation of the Si nanoparticle active semiconductor film after sintering, in which state the Ti has reacted with the insulating $SiO_2$ areas forming electrically conductive Ti oxide and Ti silicide.

FIG. 3 depicts a sequence of steps being performed in the fabrication of a TFT made using a semiconductor nanoparticle film process that consumes oxides. In Step 1 the process begins with a suitable substrate (glass, metal or plastic foil, etc.), with a basecoat already deposited, if so needed. The combined substrate-basecoat system is referred to as the substrate 102. Then, in Step 2 a semiconductor nanoparticle film 104 is deposited, typically from a colloidal solution source, and an initial solvent-evaporation annealing step is performed. The nanoparticle formulation may already contain an amount of titanium nanoparticles (Step 2B). In another realization, as shown in FIG. 2A, a thin titanium film 300 is deposited on top of the semiconductor nanoparticle film 104.

Next, in Step 3 the nanoparticle semiconductor film is sintered, either with a low thermal budget process ETA, or laser), or with a traditional furnace anneal. The reaction between Ti and the residual semiconductor oxide in the nanoparticle film occurs in this step. In Step 4 the film is then cleaned, and residual (if any) Ti is etched away. In Step 5 a thin silicon dioxide or silicon nitride film 302 is then deposited and patterned, forming a gate insulator to protect the TFT channel from subsequent etch steps. This is followed by the TFT island patterning shown in Step 6. The source 108 and drain 110 regions are then deposited and patterned in Step 7. They are typically in-situ doped n+(for NMOS) or p+ (for PMOS) amorphous Si. Then, the gate oxide 106 is deposited in Step 8, followed by contact hole opening and the deposition and patterning of the gate, and the deposition of source and drain metal 304 in Step 9.

Experimental Results

A two-wafer lot experiment was run to test the above-described fabrication sequence. Both wafers used a nanoparticle Si ink formulated at Nanogram®. The first wafer was run with the sequence described above and shown in FIG. 3. The second wafer was run with the same sequence, without including Step 2 as shown in FIG. 3, i.e. without depositing a Ti film on top of the nanoparticle active film, prior to the sintering in Step 3.

The Si nanoparticle film was spin-coated on the substrate, and soft-baked on a hotplate at 150° C. for 10 minutes to evaporate the ink solvent. For the first wafer, 50 Å of Ti were deposited via magnetron sputtering on top of the film. The second (control) wafer did not go through this step. Then, both wafers were sintered with an RTA anneal at 900° C. for 5 minutes. The etch-stop channel-protecting oxide was then deposited, 50 nanometers (nm) thick, and patterned. After patterning the active semiconductor film, the in-situ doped n+Si for the source/drain terminals was deposited via plasma-enhanced chemical vapor deposition (PECVD), 100 nm thick. The dopants of this film were furnace activated with a furnace anneal at 650° C. for five hours. After patterning the n+ the source and drain, a 200 nm thick $SiO_2$ film was deposited via PECVD, and contacts for the drain and source were dry etched in plasma. Finally, the top metal was deposited via sputtering on top, comprising of a Ti—Al stack (50 nm Al, 300 nm Al), and patterned. The devices were then ready for measurement.

The oxide consuming process films (i.e. incorporating Ti into the nanoparticle film) produced working TFTs, albeit with very low ON currents. However, the wafer fabricated without the Ti deposition step did not produce any working devices at all drain current was negligible and could not be controlled by the gate voltage. This shows that the oxide consuming process can improve to a degree the performance of a Si nanoparticle film. Of course, more practical devices need further optimized.

Figure 4:
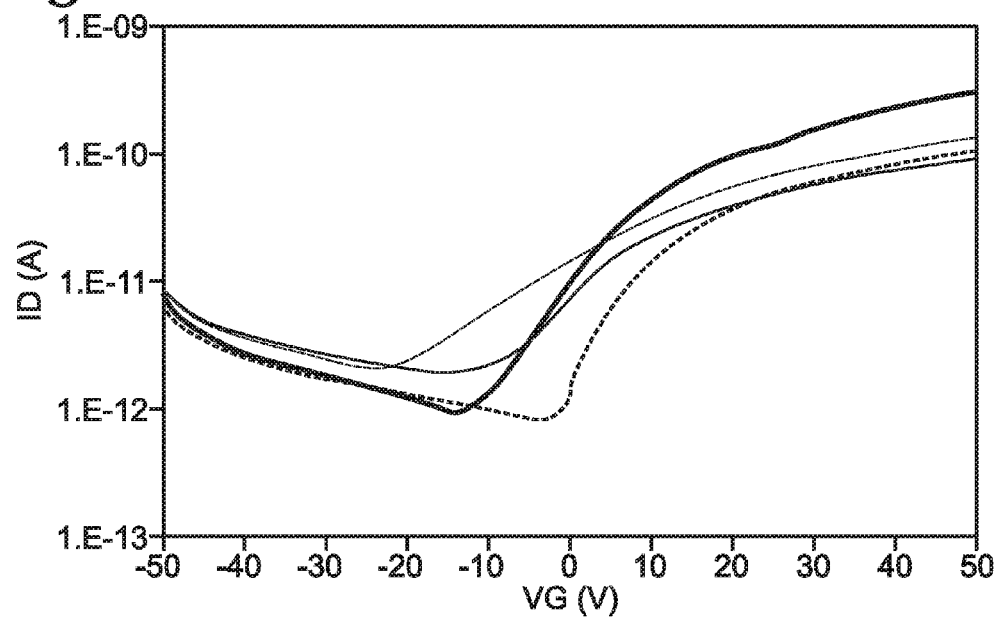
FIG. 4 is a graph of the $I_D$-$V_G$ characteristic for four NMOS Si nanoparticle TFTs with Ti incorporated into the nanoparticle film.

FIG. 4 is a graph of the $I_D$-$V_G$ characteristic for four NMOS Si nanoparticle TFTs with Ti incorporated into the nanoparticle film. W/L=80 μm/40 μm; $V_D$=20V.

Figure 5:
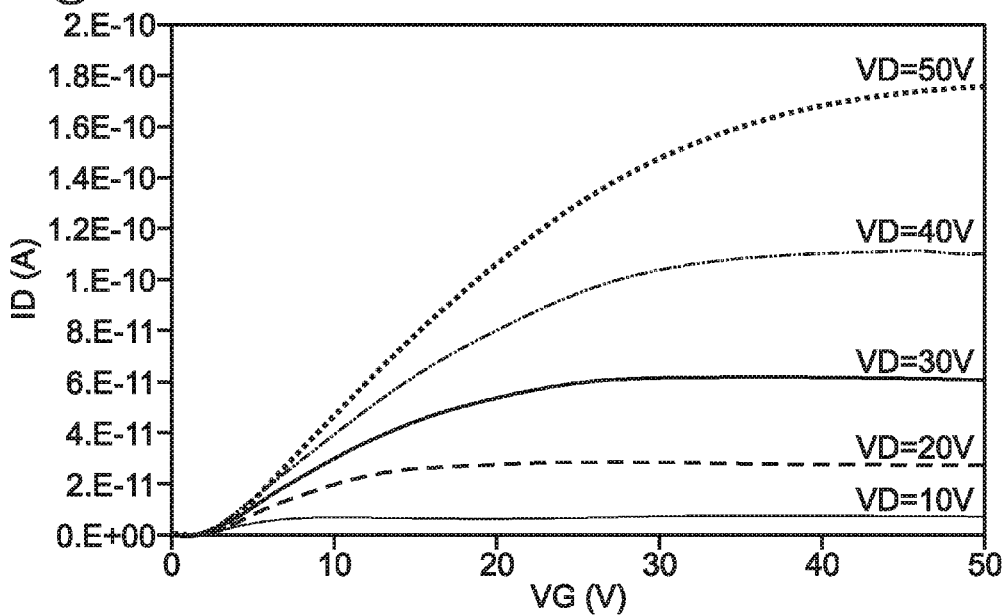
FIG. 5 shows a family of $I_D$-$V_D$ curves from a representative device.

FIG. 5 shows a family of $I_D$-$V_D$ curves from a representative device. One obvious issue limiting mobility of the fabricated devices is the high drain and source contact resistance, as it is evident from inspection of the linear region operation curves.

Although device performance is low, there is evidence of transistor action. Identically processed TFTs without the incorporated metal into the active nanoparticle film did not have transistor functionality. An optimized process should help avoid the limitations of using nanoparticle suspensions for TFT fabrication in air atmosphere.

Figure 6:
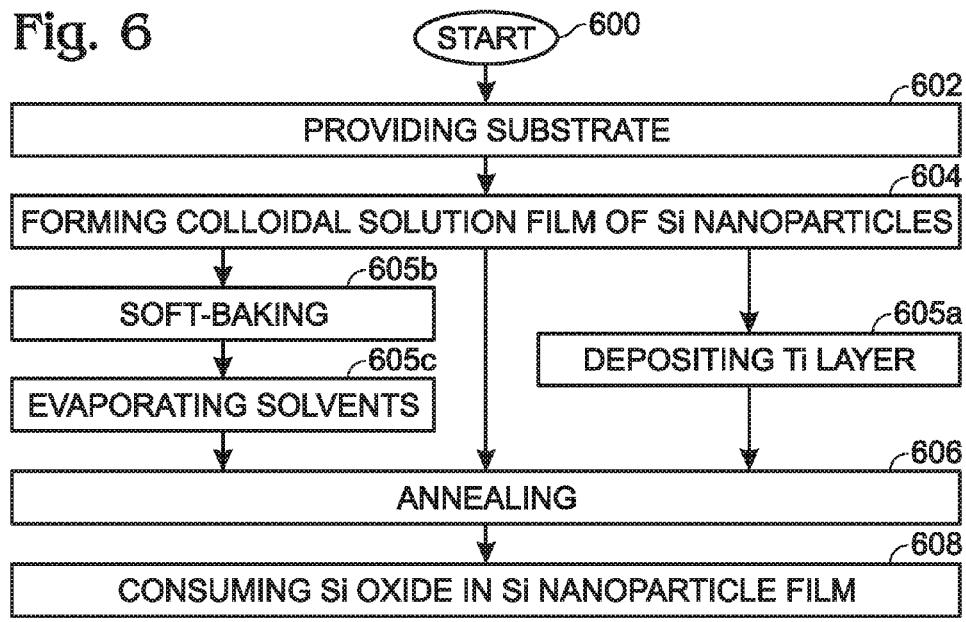
FIG. 6 is a flowchart illustrating a method for consuming oxides in a silicon Si nanoparticle film.

FIG. 6 is a flowchart illustrating a method for consuming oxides in a Si nanoparticle film. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 600.

Step 602 provides a substrate. Step 604 forms a colloidal solution film of Si nanoparticles overlying the substrate. In one aspect, Step 604 forms the colloidal solution film of Si nanoparticles in an ambient air environment including oxygen. This step forms silicon oxide in the Si nanoparticles. Step 604 uses a deposition method such as spin coating, extrusion coating, spraying, or printing. The Si nanoparticles typically have a diameter in the range from 10 to 100 nanometers (nm).

In one aspect in response to a soft-bake or low temperature annealing (Step 605b), Step 605c evaporates solvents in the colloidal solution film of Si nanoparticles.

Step 606 anneals the Si nanoparticle colloidal solution film in the presence of titanium (Ti). Step 606 may use a laser annealing, furnace annealing, or rapid thermal annealing (RTA) method. In response to the annealing, Step 608 consumes Si oxide in a resultant Si nanoparticle film. In one aspect, Step 608 also forms Ti oxide in the Si nanoparticle film. In another aspect, Step 608 forms Ti silicide in the Si nanoparticle film.

Step 608 further sinters Si and Ti oxide molecules in the Si nanoparticle film. Sintering is generally understood to be a method to make a solid film from powders based upon the principle of atomic diffusion. In this most sintering process, the Si nanoparticle powdered material is heated to a temperature below the melting point. The atoms in the powder particles diffuse across the boundaries of the particles, fusing the particles together and creating one solid piece.

In one variation, forming the colloidal solution film of Si nanoparticles overlying the substrate in Step 604 includes adding Ti nanoparticles to the colloidal solution of Si nanoparticles prior to deposition over the substrate. Alternatively, prior to annealing in Step 606, Step 605a deposits a layer of Ti film overlying the colloidal solution film of Si nanoparticles.

Note: Step 605c may be performed before or after Steps 605b and 605c.

Figure 7:
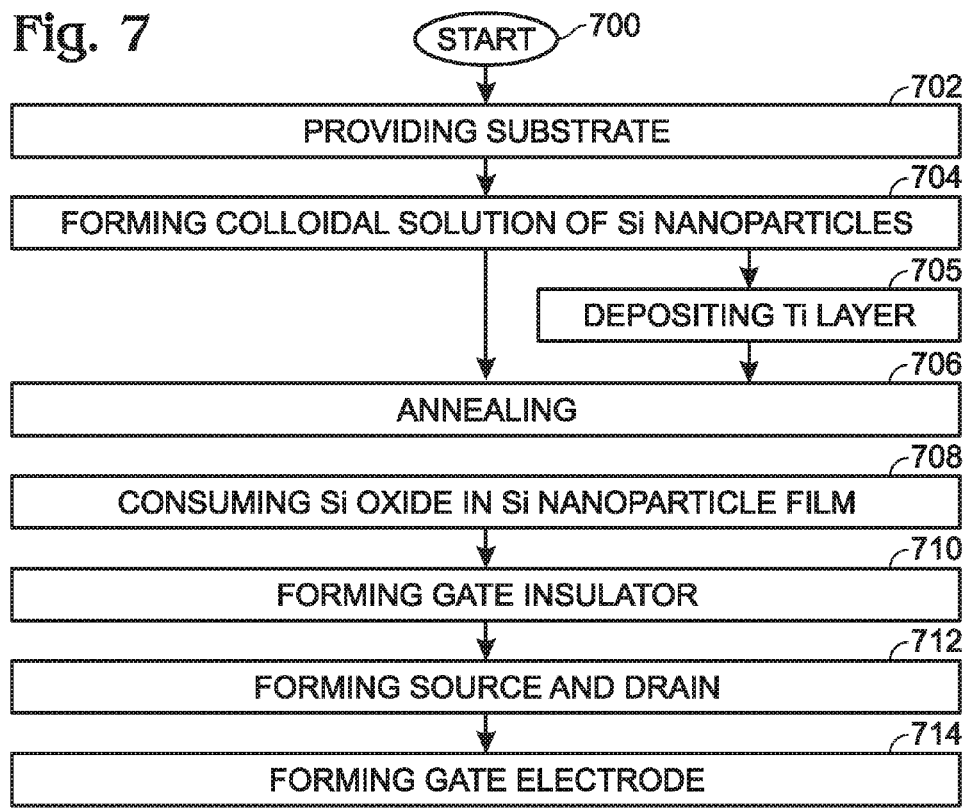
FIG. 7 is a flowchart illustrating a method for consuming oxidation in a Si nanoparticle active layer film, in the fabrication of a TFT.

FIG. 7 is a flowchart illustrating a method for consuming oxidation in a Si nanoparticle active layer film, in the fabrication of a TFT. The method begins with Step 700. Step 702 provides a substrate. Step 704 forms a colloidal solution film of Si nanoparticles overlying the substrate. In one aspect, Step 704 forms the colloidal solution film of Si nanoparticles in an ambient air environment including oxygen. The colloidal solution film of Si nanoparticles can be deposited using a spin coating, extrusion coating, spraying, or printing method. Typically, the Si nanoparticles have a diameter in the range from 10 to 100 nm.

Step 706 anneals the Si nanoparticle colloidal solution film in the presence of Ti, forming a Si nanoparticle active layer film. Step 706 may use a laser annealing, furnace annealing, or RTA method. In response to the annealing, Step 708 consumes Si oxide in the Si nanoparticle active layer film. Step 710 forms a gate insulator overlying the Si nanoparticle active layer film. Step 712 forms source and drain regions in the Si nanoparticle active layer film. Step 714 forms a gate electrode overlying the gate insulator.

In one aspect, consuming the Si oxide in the Si nanoparticle active layer film (Step 708) includes forming Ti oxide in the Si nanoparticle active layer film. In another aspect, Step 708 sinters Si and Ti oxide molecules in the Si nanoparticle active layer film.

In one aspect, forming the colloidal solution film of Si nanoparticles overlying the substrate in Step 704 includes adding Ti nanoparticles to the colloidal solution of Si nanoparticles prior to deposition over the substrate. Alternatively, prior to annealing in Step 706, Step 705 deposits a layer of Ti film overlying the colloidal solution film of Si nanoparticles.

A method for consuming oxide in a Si nanoparticle film has been provided, as well as a TFT made using the method. Examples of particular process steps have been presented to illustrate the invention. However, the invention is not limited to merely these examples. While Si is the only semiconductor material mentioned, the process also consumes the oxides in other, unnamed semiconductor materials. Other variations and embodiments of the invention will occur to those skilled in the art.

We claim:

1. A method for consuming oxides in a silicon (Si) nanoparticle film, the method comprising:
   providing a substrate;
   forming a colloidal solution film of Si nanoparticles overlying the substrate;
   prior to annealing, depositing a layer of titanium (Ti) film overlying the colloidal solution film of Si nanoparticles;
   annealing the Si nanoparticle colloidal solution film in the presence of Ti; and,
   wherein the annealing consumes Si oxide in a resultant Si nanoparticle film.

2. The method of claim 1 wherein the consuming the Si oxide in the Si nanoparticle film includes forming Ti oxide in the Si nanoparticle film.

3. The method of claim 2 wherein the consuming Si oxide in the Si nanoparticle film includes sintering Si and Ti oxide molecules in the Si nanoparticle film.

4. The method of claim 2 wherein the consuming Si oxide in the Si nanoparticle film includes forming Ti silicide in the Si nanoparticle film.

5. The method of claim 1 wherein the forming the colloidal solution film of Si nanoparticles overlying the substrate includes forming the colloidal solution film of Si nanoparticles in an ambient air environment including oxygen.

6. The method of claim 1 wherein the forming the colloidal solution film of Si nanoparticles overlying the substrate includes adding Ti nanoparticles to the colloidal solution of Si nanoparticles prior to deposition over the substrate.

7. The method of claim 1 wherein the forming the colloidal solution film of Si nanoparticles overlying the substrate includes depositing the colloidal solution film of Si nanoparticles using a method selected from a group consisting of spin coating, extrusion coating, spraying, and printing.

8. The method of claim 1 wherein the forming the colloidal solution film of Si nanoparticles overlying the substrate includes forming a colloidal solution film with Si nanoparticles having a diameter in a range from 10 to 100 nanometers (nm).

9. The method of claim 1 wherein the annealing includes using a method selected from a group consisting of laser annealing, furnace, and rapid thermal annealing (RTA).

10. In the fabrication of a thin-film transistor (TFT), a method for consuming oxidation in a silicon (Si) nanoparticle active layer film, the method comprising:
    providing a substrate;
    forming a colloidal solution film of Si nanoparticles overlying the substrate;
    annealing the Si nanoparticle colloidal solution film in the presence of titanium (Ti), forming a Si nanoparticle active layer film;
    wherein the annealing consumes Si oxide in the Si nanoparticle active layer film;
    forming a gate insulator overlying the Si nanoparticle active layer film;
    forming source and drain regions in the Si nanoparticle active layer film; and,
    forming a gate electrode overlying the gate insulator.

11. The method of claim 10 wherein the consuming the Si oxide in the Si nanoparticle active layer film includes forming Ti oxide in the Si nanoparticle active layer film.

12. The method of claim 10 wherein the consuming silicon oxide in the Si nanoparticle active layer film includes sintering Si and Ti oxide molecules in the Si nanoparticle active layer film.

13. The method of claim 10 wherein the forming the colloidal solution film of Si nanoparticles overlying the substrate includes forming the colloidal solution film of Si nanoparticles in an ambient air environment including oxygen.

14. The method of claim 10 wherein the forming the colloidal solution film of Si nanoparticles overlying the substrate includes adding Ti nanoparticles to the colloidal solution of Si nanoparticles prior to deposition over the substrate.

15. The method of claim 10 further comprising:
    prior to annealing, depositing a layer of Ti film overlying the colloidal solution film of Si nanoparticles.

16. The method of claim 10 wherein the forming the colloidal solution film of Si nanoparticles overlying the substrate includes depositing the colloidal solution film of Si nanoparticles using a method selected from a group consisting of spin coating, extrusion coating, spraying, and printing.

17. The method of claim 10 wherein the forming the colloidal solution film of Si nanoparticles overlying the substrate includes forming a colloidal solution film with Si nanoparticles having a diameter in a range from 10 to 100 nanometers (nm).

18. The method of claim 10 wherein the annealing includes using a method selected from a group consisting of laser annealing, furnace, and rapid thermal annealing (RTA).

* * * * *